United States Patent
Wu et al.

(10) Patent No.: US 10,140,234 B2
(45) Date of Patent: Nov. 27, 2018

(54) STORAGE APPARATUS AND DATA ACCESS METHOD

(71) Applicant: Huawei Technologies Co., Ltd., Shenzhen (CN)

(72) Inventors: Rangliang Wu, Shenzhen (CN); Yuzhu Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 15 days.

(21) Appl. No.: 15/454,177

(22) Filed: Mar. 9, 2017

(65) Prior Publication Data

US 2017/0262397 A1    Sep. 14, 2017

(30) Foreign Application Priority Data

Mar. 10, 2016  (CN) .......................... 2016 1 0134908

(51) Int. Cl.
| | |
|---|---|
| *G06F 13/40* | (2006.01) |
| *G06F 13/16* | (2006.01) |
| *G11C 8/10* | (2006.01) |
| *G11C 5/06* | (2006.01) |
| *G11C 5/04* | (2006.01) |
| *G11C 5/02* | (2006.01) |
| *G11C 8/12* | (2006.01) |

(52) U.S. Cl.
CPC ...... *G06F 13/4022* (2013.01); *G06F 13/1668* (2013.01); *G06F 13/4068* (2013.01); *G11C 5/025* (2013.01); *G11C 5/04* (2013.01); *G11C 5/066* (2013.01); *G11C 8/12* (2013.01); *G11C 2207/105* (2013.01)

(58) Field of Classification Search
None
See application file for complete search history.

(56) References Cited

U.S. PATENT DOCUMENTS

| | | | |
|---|---|---|---|
| 9,318,156 B2 * | 4/2016 | Kanapathippillai | G11C 5/14 |
| 9,905,303 B2 * | 2/2018 | Kanapathippillai | G11C 5/04 |
| 2007/0058410 A1 * | 3/2007 | Rajan | G11C 5/02 |
| | | | 365/63 |

* cited by examiner

*Primary Examiner* — Idriss N Alrobaye
*Assistant Examiner* — Dayton-Lewis Taylor
(74) *Attorney, Agent, or Firm* — Conley Rose, P.C.

(57) ABSTRACT

A storage apparatus includes a printed circuit board (PCB) and multiple memory chips symmetrically arranged on two sides of the PCB, where multiple memory chips on one side of the PCB form a rank, and multiple memory chips on the other side of the PCB form a rank; a memory chip includes multiple pins; multiple cables are disposed in the PCB; and one cable of the multiple cables is connected to two pins in a same position on the two sides of the PCB.

21 Claims, 4 Drawing Sheets

STORAGE APPARATUS AND DATA ACCESS METHOD

CROSS-REFERENCE TO RELATED APPLICATIONS

This application claims priority to Chinese patent application number 201610134908.0 filed on Mar. 10, 2016, which is incorporated by reference.

TECHNICAL FIELD

The present disclosure relates to the field of storage technologies, and in particular, to a storage apparatus and a data access method.

BACKGROUND

A dual in-line memory module (DIMM) usually includes a printed circuit board (PCB) and multiple memory chips distributed on the PCB, and the memory chip may be usually implemented by using a double data rate synchronous dynamic random-access memory (DDR SDRAM) that is most widely applied currently. The multiple memory chips are distributed on two sides of the PCB to form a symmetrical structure, memory chips on each side constitute an independent rank, and same pins in a same position of memory chips are connected to a same cable. Such a topology is referred to as a DDR dual-rank structure. The PCB in the DIMM is a multilayered structure.

Because the memory chips disposed on the two sides of the PCB have an exactly same structure, when the memory chips are symmetrically disposed, same pins of two memory chips may have different positions. Specifically, same pins of two memory chips are exactly symmetrically distributed about a midpoint of a line of centers of the two memory chips. In this case, a cable connected to same pins of two memory chips is usually designed as follows: A first cable section is disposed at a layer of the multilayered PCB board, one end of the first cable section is used as an input end, and the other end of the first cable section is connected to two pins by using a second cable section and a third cable section. Specifically, via holes separately facing the two sides of the PCB are disposed at the other end of the first cable section, and then the other end of the first cable section is connected to the two pins by using the second cable section and the third cable section, to form a T-type cable design. The other end of the first cable section is usually disposed close to one of the two pins. In this way, a relatively short second cable section connected to one pin may be ensured, and signal integrity (SI) of the pin is ensured. However, a relatively long third cable section connected to the other pin affects SI of the other pin. Consequently, overall performance of the DDR Dual Rank deteriorates. In addition, each cable may have a relatively long third cable section. Therefore, multiple layers need to be designed in a PCB to implement those cables, so as to prevent interference between the cables. Extremely high technological requirements are imposed on the PCB.

SUMMARY

To resolve a problem of a relatively long cable section connected to one pin when a same cable is connected to same pins of two memory chips in DDR dual rank, embodiments of the present disclosure provide a storage apparatus and a data access method. The technical solutions are as follows:

According to a first aspect, a storage apparatus is provided, including a PCB and multiple memory chips symmetrically arranged on two sides of the PCB, where multiple memory chips on one side of the PCB form a rank, and multiple memory chips on the other side of the PCB form a rank; the memory chip includes multiple pins; multiple cables are disposed in the PCB; and one cable of the multiple cables is connected to two pins in a same position on the two sides of the PCB; where the storage apparatus further includes: a conversion module configured to obtain a system bus signal sent, and convert the system bus signal into a rank selection signal and a memory chip bus signal, where the system bus signal includes a system data bus signal and a system address/control bus signal, and the memory chip bus signal includes a memory chip data bus signal and a memory chip address/control bus signal; a rank decision device configured to determine a selected rank according to the rank selection signal; and a switching array configured to output, to each cable of the multiple cables according to a correspondence between pins of memory chips in the selected rank and the multiple cables, a memory chip bus signal corresponding to a pin of a memory chip in the selected rank.

According to the present disclosure, two pins in a same position on two sides of a PCB are connected by using one cable. In this case, two extremely short cable sections are connected to the two pins, thereby avoiding a problem of an excessively long cable section connected to one pin when one cable is connected to same pins of two memory chips. In addition, a conversion module, a rank decision device, and a switching array are designed to control a signal of each cable, so that a signal that is input to each cable is corresponding to a pin, connected to the cable, of a memory chip in a selected rank, and an accurate signal that is output to each pin by using the cable is ensured. According to the foregoing solution, extremely short cable sections connected to two pins ensure SI of the two pins, avoid a multilayered PCB design, and reduce technological PCB requirements.

With reference to the first aspect, in a first implementation manner of the first aspect, the conversion module includes: an address decoder configured to obtain the system address/control bus signal sent by using a system address/control bus in the system bus, and convert the system address/control bus signal into the rank selection signal and the memory chip address/control bus signal; and a data format conversion unit configured to obtain the system data bus signal sent by using a system data bus in the system bus, and convert the system data bus signal into the memory chip data bus signal.

In this implementation manner, the conversion module includes two units: the address decoder and the data format conversion unit, and implements conversion of the system address/control bus signal and the system data bus signal.

With reference to the first implementation manner of the first aspect, in a second implementation manner of the first aspect, the switching array includes: multiple signal output units, where each signal output unit of the multiple signal output units is connected to one cable of the multiple cables; and a control unit configured to control an output signal of each signal output unit according to the correspondence between pins of memory chips in the selected rank and the multiple cables.

With reference to the second implementation manner of the first aspect, in a third implementation manner of the first aspect, the signal output unit is a single-pole double-throw switch, an output end of the single-pole double-throw switch is connected to the cable, two input ends of the single-pole double-throw switch are connected to two output terminals of the conversion module, each output terminal of the conversion module is connected to an input end of each of two single-pole double-throw switches, the output terminals of the conversion module are disposed correspondingly to pins of memory chips, and the output terminals of the conversion module and the pins of the memory chips that are correspondingly disposed are connected to two ends of a same single-pole double-throw switch.

In this implementation manner, the output terminals of the conversion module and the pins of the memory chips that are correspondingly disposed are connected to two ends of a same single-pole double-throw switch. In this way, when the output end of the single-pole double-throw switch is connected to two pins of different functions by using the cable, the input ends of the single-pole double-throw switch are also connected to two corresponding output terminals. Then, because the two pins are on two different ranks, only one pin may operate. Therefore, one input end is selected by using the single-pole double-throw switch.

With reference to the third implementation manner of the first aspect, in a fourth implementation manner of the first aspect, the rank decision device is configured to output a rank control signal, where the rank control signal is used to indicate the selected rank; and the control unit is configured to obtain the rank control signal; determine, according to a correspondence between the rank control signal and a switch status, a switch status corresponding to the obtained rank control signal, where the switch status is used to indicate that one input end of the single-pole double-throw switch is connected to the output end; and control, according to the switch status, one input end of the single-pole double-throw switch to be connected to the output end.

In the foregoing implementation manner, the two input ends of the single-pole double-throw switch are separately connected to the output terminals of the conversion module, so that a corresponding signal may be output as long as the control unit controls, according to the rank control signal, the single-pole double-throw switch to perform switchover, and implementation is easy.

With reference to the third implementation manner of the first aspect, in a fifth implementation manner of the first aspect, a memory chip address/control bus is disposed between the address decoder and the switching array, a memory chip data bus is disposed between the data format conversion unit and the switching array, an input end of the single-pole double-throw switch is connected to an output terminal of the address decoder by using the memory chip address/control bus, and an input end of the single-pole double-throw switch is connected to an output terminal of the data format conversion unit by using the memory chip data bus.

With reference to the first aspect, in a sixth implementation manner of the first aspect, the conversion module, the rank decision device, and the switching array are integrated on a same system on chip (SoC) chip.

With reference to the sixth implementation manner of the first aspect, in a seventh implementation manner of the first aspect, the SoC chip includes a memory interface logic circuit, the memory interface logic circuit includes a DDR controller and a DDR physical layer, the conversion module and the rank decision device are disposed in the DDR controller, and the switching array is disposed in the DDR physical layer.

According to a second aspect, a data access method is provided, where the method is implemented based on the storage apparatus in any implementation manner of the first aspect, and the method includes: obtaining a system bus signal, and converting the system bus signal into a rank selection signal and a memory chip bus signal, where the system bus signal includes a system data bus signal and a system address/control bus signal, and the memory chip bus signal includes a memory chip data bus signal and a memory chip address/control bus signal; determining a selected rank according to the rank selection signal; and outputting, to each cable of multiple cables according to a correspondence between pins of memory chips in the selected rank and the multiple cables, a memory chip bus signal corresponding to a pin of a memory chip in the selected rank.

With reference to the second aspect, in a first implementation manner of the second aspect, the obtaining a system bus signal, and converting the system bus signal into a rank selection signal and a memory chip bus signal includes: obtaining the system address/control bus signal sent by using a system address/control bus in the system bus, and converting the system address/control bus signal into the rank selection signal and the memory chip address/control bus signal; and obtaining the system data bus signal sent by using a system data bus in the system bus, and converting the system data bus signal into the memory chip data bus signal.

With reference to the second aspect, in a second implementation manner of the second aspect, the determining a selected rank according to the rank selection signal includes: outputting a rank control signal, where the rank control signal is used to indicate the selected rank.

With reference to the second implementation manner of the second aspect, in a third implementation manner of the second aspect, the outputting, to each cable of multiple cables according to a correspondence between pins of memory chips in the selected rank and the multiple cables, a memory chip bus signal corresponding to a pin of a memory chip in the selected rank includes: controlling an output signal of each signal output unit according to the correspondence between pins of memory chips in the selected rank and the multiple cables.

With reference to the third implementation manner of the second aspect, in a fourth implementation manner of the second aspect, the controlling an output signal of each signal output unit according to the correspondence between pins of memory chips in the selected rank and the multiple cables includes: obtaining the rank control signal; determining, according to a correspondence between the rank control signal and a switch status, a switch status corresponding to the obtained rank control signal, where the switch status is used to indicate that one input end of a single-pole double-throw switch is connected to an output end; and controlling, according to the switch status, one input end of the single-pole double-throw switch to be connected to the output end.

The technical solutions provided in the embodiments of the present disclosure have the following beneficial effects:

Two pins in a same position on two sides of a PCB are connected by using one cable. In this case, two extremely short cable sections are connected to the two pins, thereby avoiding a problem of an excessively long cable section connected to one pin when one cable is connected to same pins of two memory chips. In addition, a conversion module, a rank decision device, and a switching array are designed to control a signal of each cable, so that a signal that is input to each cable is corresponding to a pin, connected to the cable, of a memory chip in a selected rank, and an accurate signal that is output to each pin by using the cable is ensured.

According to the foregoing solutions, extremely short cable sections connected to two pins ensure SI of the two pins, avoid a multilayered PCB design, and reduce technological PCB requirements.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

Figure 1:
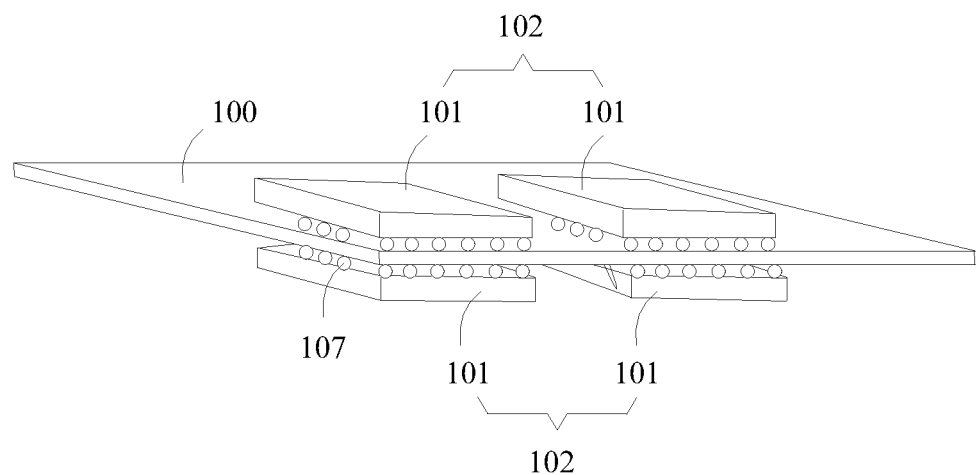
FIG. 1 is a schematic structural diagram of a storage apparatus according to an embodiment of the present disclosure.

To make the objectives, technical solutions, and advantages of the present disclosure clearer, the following further describes the embodiments of the present disclosure in detail with reference to the accompanying drawings.

For ease of understanding the technical solutions provided in the embodiments of the present disclosure, related content of DDR Dual Rank is described first.

As described in the Background, the DDR Dual Rank includes two symmetrically disposed ranks. The rank is defined in the following manner. To ensure normal operation of a central processing unit (CPU), a conventional memory system needs to transmit, at one time, all data required by the CPU in one transmission cycle, and a capacity of data that can be received by the CPU in one transmission cycle is a bit width of a system bus. For example, a 64-bit processor may transmit data of 64 bits in each transmission cycle. However, because a bit width of each memory chip is less than a bit width of the CPU, a data transmission requirement of the CPU can be met only by combining multiple memory chips, and the multiple combined memory chips are one rank.

A memory chip usually includes multiple logical memory banks that are mutually independent. Each bank is a storage array. Data is stored in multiple storage units of the storage array. The multiple storage units include several rows and several columns.

The CPU reads data and performs a command operation (such as refreshing and initialization) on the DDR Dual Rank by using the system bus. The system bus includes a system data bus and a system address/control bus. The system data bus is configured to transfer a system data bus signal, that is, to implement data input and output. The system address/control bus is configured to transfer a system address/control bus signal that includes an address signal, a control signal, and a clock signal. The control signal includes a read/write signal, a chip select signal, an interrupt acknowledge signal, an initialization signal, and the like.

The following describes an operation process of the CPU and the DDR Dual Rank by using data read as an example. When the CPU needs to read data in the DDR Dual Rank, the CPU sends a system address/control bus signal to a DDR controller by using a system address/control bus. After receiving the foregoing signal sent by using a system bus, the DDR controller first needs to determine, according to the system address/control bus signal, a rank to be accessed by the CPU, and then generates a DDR address/control signal corresponding to the rank. A memory chip opens a page, such as a Page 1, according to a bank address, a row address and a row address strobe in the DDR address/control signal, and then reads data according to a column address at which the data is located and a column address strobe. The DDR Dual rank includes two ranks, a DDR address bus is one bit less than an address bus in the system bus, and the extra bit in the address/control bus in the system bus may be used to identify the ranks. Therefore, in the foregoing process, a rank may be selected according to an address signal transferred by using the address/control bus in the system bus.

In the foregoing data read and write process, only one of the two ranks disposed on two sides of a PCB board of the DDR dual rank may be activated. Therefore, only one of two pins connected by a same cable can receive a signal that is output by using the cable. However, when the same cable is connected to the two pins, a relatively long cable section connected to one pin affects SI of the pin. Therefore, in the present disclosure, a manner of connecting the cable and the pins is re-designed, so that both cable sections connected to the two pins are the shortest.

FIG. 1 is a schematic structural diagram of a storage apparatus according to an embodiment of the present disclosure. Referring to FIG. 1, the storage apparatus includes a PCB 100 and multiple memory chips 101 symmetrically arranged on two sides of the PCB 100. Multiple memory chips 101 on one side of the PCB 100 form a rank 102, and multiple memory chips 101 on the other side of the PCB 100 form a rank 102. A memory chip 101 includes multiple pins (not shown in FIG. 1). Multiple cables are disposed in the PCB 100. One cable of the multiple cables is connected to two pins in a same position on the two sides of the PCB 100.

Figure 2:
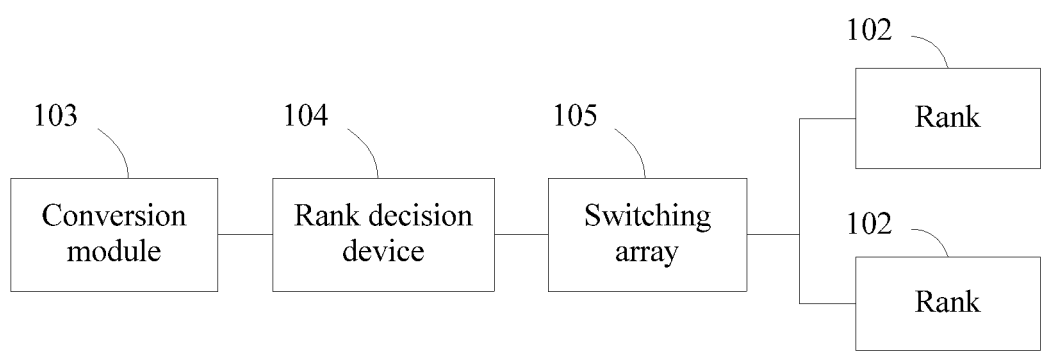
FIG. 2 is a schematic structural diagram of a storage apparatus according to an embodiment of the present disclosure.

FIG. 2 is a block diagram of a storage apparatus. The storage apparatus further includes: a conversion module 103 configured to obtain a system bus signal sent by using a system bus, and convert the system bus signal into a rank selection signal and a memory chip bus signal, where the system bus signal includes a system data bus signal and a system address/control bus signal, and the memory chip bus signal includes a memory chip data bus signal and a memory chip address/control bus signal; a rank decision device 104 configured to determine a selected rank 102 according to the rank selection signal; and a switching array 105 configured to output, to each cable of multiple cables according to a correspondence between pins of memory chips 101 in the selected rank 102 and the multiple cables, a memory chip bus signal corresponding to a pin of a memory chip 101 in the selected rank 102.

Figure 3:
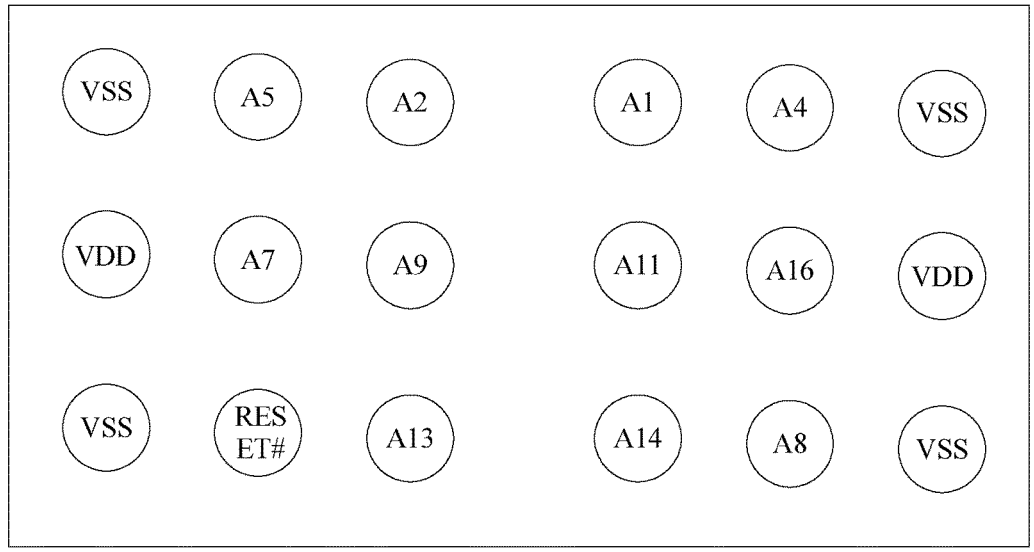
FIG. 3 is a pin distribution diagram of two memory chips disposed in a corresponding position of a PCB according to an embodiment of the present disclosure.
Figure 3:
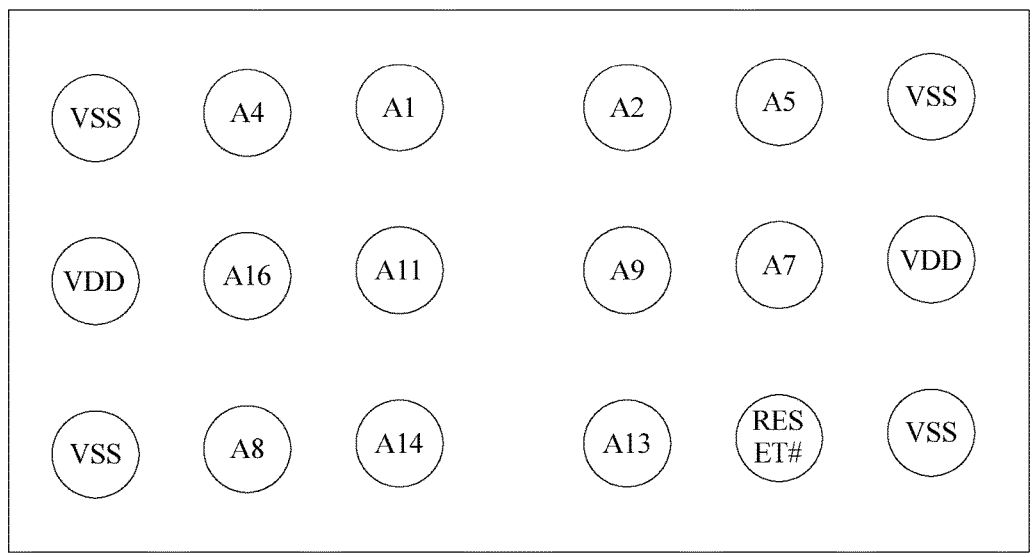

FIG. 3 is a pin distribution diagram of two memory chips 101 disposed in a corresponding position of a PCB 100 according to an embodiment of the present disclosure. It may be seen that, two pins in a same position of the PCB 100 may be different, for example, A13 and A14; or two pins in a same position of the PCB 100 may be the same, for example, VSS.

According to the present disclosure, two pins in a same position on two sides of a PCB are connected by using one cable. In this case, two extremely short cable sections are connected to the two pins, thereby avoiding a problem of an excessively long cable section connected to one pin when one cable is connected to same pins of two memory chips. In addition, a conversion module, a rank decision device, and a switching array are designed to control a signal of each cable, so that a signal that is input to each cable is corresponding to a pin, connected to the cable, in a selected rank, and an accurate signal that is output to each pin by using the cable is ensured. According to the foregoing solutions, extremely short cable sections connected to two pins ensure SI of the two pins, avoid a multilayered design of a PCB (for example, eight-layers may be reduced to four layers or six layers), and reduce technological requirements of the PCB.

Figure 4:
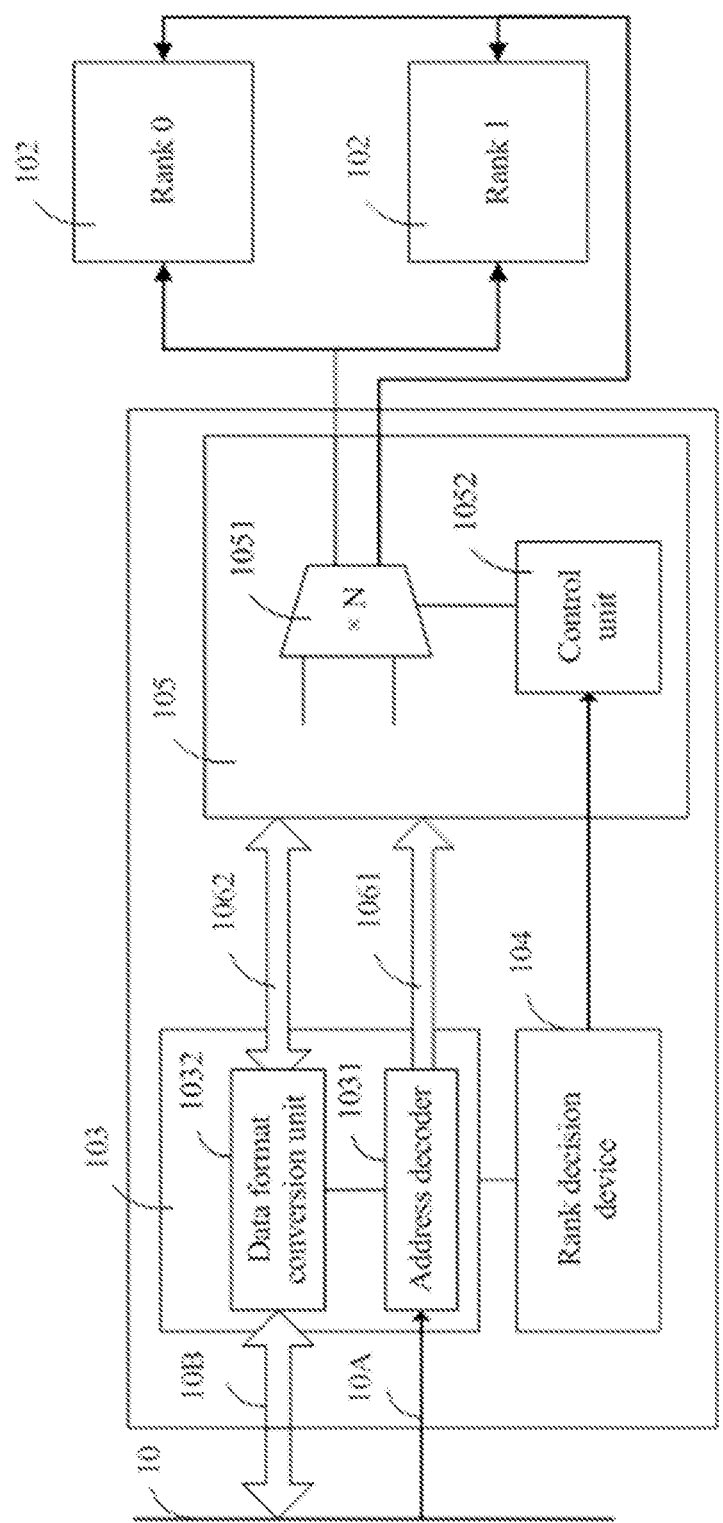
FIG. 4 is a schematic diagram of a topology of a storage apparatus according to an embodiment of the present disclosure.

FIG. 4 is a schematic diagram of a topology of a storage apparatus according to an embodiment of the present disclosure. Referring to FIG. 4, in comparison with the storage apparatus provided in FIG. 2, a conversion module 103 includes: an address decoder 1031 configured to obtain a system address/control bus signal sent by using a system address/control bus 10A in a system bus 10, and convert the system address/control bus signal into a rank selection signal and a memory chip address/control bus signal; and a data format conversion unit 1032 configured to obtain a system data bus signal sent by using a system data bus 10B in the system bus, and convert the system data bus signal into a memory chip data bus signal.

The system bus 10 includes the system address/control bus 10A and the system data bus 10B.

In FIG. 4, the two ranks 102 on the upper face and the lower face of the PCB 100 in FIG. 1 are respectively labeled as a rank 0 and a rank 1.

In this implementation manner, the conversion module 103 includes two units: the address decoder 1031 and the data format conversion unit 1032, which jointly finish functions implemented by the conversion module 103.

It is obviously known that in this embodiment of the present disclosure, there may be one or two switching arrays 105. The two switching arrays may be separately configured to control transmission of the memory chip address/control bus signal and the memory chip data bus signal.

In a possible implementation manner, the switching array 105 includes: multiple signal output units 1051, where each signal output unit 1051 of the multiple signal output units 1051 is connected to one cable of multiple cables; and a control unit 1052 configured to control an output signal of each signal output unit 1051 according to a correspondence between pins of memory chips in a selected rank 102 and the multiple cables.

In a possible implementation manner, the signal output unit 1051 is a single-pole double-throw switch. An output end of the single-pole double-throw switch is connected to a cable. The conversion module 103 has multiple output terminals. Two input ends of the single-pole double-throw switch are connected to the output terminals of the conversion module 103. Each output terminal of the conversion module 103 is connected to an input end of each of two single-pole double-throw switches. The output terminals of the conversion module 103 are disposed correspondingly to pins of memory chips 101, and the output terminals of the conversion module 103 and the pins of the memory chips that are correspondingly disposed are connected to two ends of a same single-pole double-throw switch. Two input ends connected by one output terminal of the conversion module 103 may be on one single-pole double-throw switch, or on two single-pole double-throw switches.

For example, an output end of a first single-pole double-throw switch in the storage apparatus is connected to A13 of the rank 0 and A14 of the rank 1 by using a cable, an output end of a second single-pole double-throw switch is connected to A14 of the rank 0 and A13 of the rank 1 by using a cable. An output terminal of the conversion module 103 that is configured to output a signal corresponding to A13 is connected to one input end of each of the two single-pole double-throw switches. An output terminal of the conversion module 103 that is configured to output a signal corresponding to A14 is connected to the other input end of each of the two single-pole double-throw switches. In this way, when the rank 0 is selected, an A13-connected input end of the first single-pole double-throw switch is turned on, and an A14-connected input end of the second single-pole double-throw switch is turned on.

In a possible implementation manner, a rank decision device 104 is configured to output a rank control signal, where the rank control signal is used to indicate the selected rank 102.

The control unit 1052 is configured to obtain the rank control signal; determine, according to a correspondence between the rank control signal and a switch status, a switch status corresponding to the obtained rank control signal, where the switch status is used to indicate that one input end of the single-pole double-throw switch is connected to the output end; and control, according to the switch status, one input end of the single-pole double-throw switch to be connected to the output end.

The correspondence between the rank control signal and a switch status may be preset in the control unit 1052. After the rank control signal is received, a corresponding input end is turned on according to the correspondence. For example, the rank control signal may be represented by using high and low levels, and when the control unit 1052 receives a high level, an input end corresponding to the rank 0 is turned on.

In the foregoing implementation manner, the two input ends of the single-pole double-throw switch are separately connected to the output terminals of the conversion module 103, so that a corresponding signal may be output as long as the control unit 1052 controls, according to the rank control signal, the single-pole double-throw switch to perform switchover, and implementation is easy.

Further, in this embodiment, a correspondence between a rank and an input end of a switch may be further represented by using a position. For example, two input ends of each single-pole double-throw switch are oppositely distributed, an input end on one side (such as the upper side) is corresponding to the rank 0, and an input end on the other side (such as the lower side) is corresponding to the rank 1. Therefore, when the rank control signal indicates that the selected rank is the rank 0, input ends on one side of all single-pole double-throw switches are turned on.

Further, a memory chip address/control bus 1061 is disposed between the address decoder 1031 and the switching array 105, a memory chip data bus 1062 is disposed between the data format conversion unit 1032 and the switching array 105, an input end of the single-pole double-throw switch is connected to an output terminal of the address decoder 1031 by using the memory chip address/control bus 1061, and an input end of the single-pole double-throw switch is connected to an output terminal of the data format conversion unit 1032 by using the memory chip data bus 1062.

The conversion module 103 includes the address decoder 1031 and the data format conversion unit 1032, and correspondingly, the output terminals of the conversion module 103 include the output terminal of the address decoder 1031 and the output terminal of the data format conversion unit 1032.

The memory chip address/control bus 1061 and the memory chip data bus 1062 combine into a memory chip bus, also referred to as a DDR bus.

In a possible implementation manner, the conversion module 103, the rank decision device 104, and the switching array 105 are integrated on a same SoC chip.

Specifically, the SoC chip includes a memory interface logic circuit, the memory interface logic circuit includes a DDR controller and a DDR physical layer, the conversion module 103 and the rank decision device 104 are disposed in the DDR controller, and the switching array 105 is disposed in the DDR physical layer.

Further, each memory chip 101 includes various types of functional components, and these functional components are used for row/column address reusing, row/column address decoding, I/O control, and the like. Details are not described in this embodiment.

In a possible implementation manner, the memory chip 101 is an SDRAM memory chip.

As shown in FIG. 1, a metal ball 107 is disposed on the PCB 100, and a pin of the memory chip 101 is connected to a cable by using the ball 107.

In this embodiment of the present disclosure, the PCB 100 is a multilayered board, and cables are designed in the multilayered PCB 100.

In this embodiment of the present disclosure, during line design, multiple cables are designed in a manner in which one cable is connected to two pins in a same position on two sides of a PCB board. After the multiple cables are designed, the following signal correspondence table may be obtained:

| Cable identifier | Connected to a pin of a memory chip in a rank 0 | Connected to a pin of a memory chip in a rank 1 |
| --- | --- | --- |
| Signal_0 | A0 (that is, Addr0) | A12 |
| Signal_1 | A1 | A2 |
| Signal_2 | A2 | A1 |
| Signal_3 | A3 | A4 |
| Signal_4 | A4 | A3 |
| Signal_5 | A5 | A6 |
| Signal_6 | A6 | A5 |
| Signal_7 | A7 | A8 |
| Signal_8 | A8 | A7 |
| Signal_9 | A9 | A11 |
| Signal_10 | A10 | A10 |
| Signal_11 | A11 | A9 |
| Signal_12 | A12 | A0 |
| Signal_13 | A13 | A14 |
| Signal_14 | A14 | A13 |
| Signal_15 | BA0 | BA2 |
| Signal_16 | BA1 | BA1 |
| Signal_17 | BA2 | BA0 |
| Signal_18 | RAS (row address strobe) | RAS |
| Signal_19 | CAS (column address strobe) | CAS |
| Signal_20 | WEN (write signal) | WEN |

The foregoing table identifies pins of memory chips in the two ranks that are connected by each cable. According to pins in the two ranks that are connected by a cable connected to each single-pole double-throw switch, the single-pole double-throw switch may be connected to corresponding output terminals of the conversion module 103 by using a memory chip bus. For example, if an output end of a single-pole double-throw switch is connected to a cable Signal_13, two input ends of the single-pole double-throw switch are separately connected to a memory chip address/control bus A13 and a memory chip address/control bus A14, so as to connect to output terminals of the conversion module 103 for outputting a memory chip address/control bus signal A13 and a memory chip address/control bus signal A14. The memory chip buses are correspondingly connected to the output terminals of the conversion module 103.

Certainly, content of the foregoing table is merely an example, and may be designed according to an actual requirement in actual application.

In an actual operation process, the storage apparatus may receive, from a CPU, two types of signals: a command and a read/write request. The command includes an initialization command, an automatic refresh command, and the like.

For the command delivered by the CPU, after receiving the command, the storage apparatus determines a selected rank according to the command, generates a rank control signal, and controls a single-pole double-throw switch according to the rank control signal, so that the command may be transmitted to the selected rank, and memory chips in the selected rank execute the command.

For the read/write request delivered by the CPU, after receiving the read/write request, the storage apparatus determines a selected rank according to the read/write request, generates a rank control signal, and controls a single-pole double-throw switch according to the rank control signal, so that a read request or to-be-written data may be transmitted to the selected rank, and memory chips in the selected rank finish the read and write.

Figure 5:
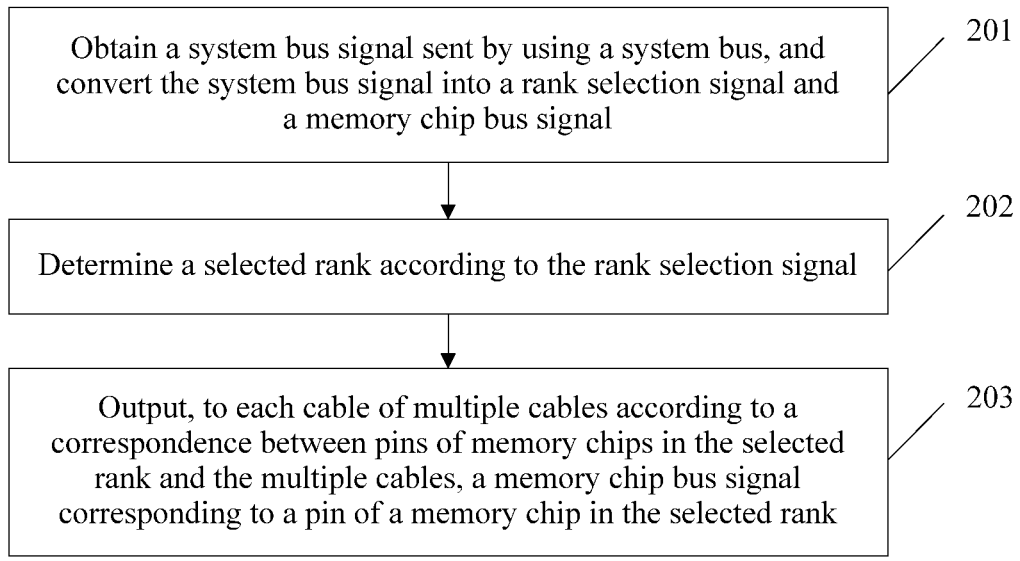
FIG. 5 is a flowchart of a data access method according to an embodiment of the present disclosure.

FIG. 5 is a flowchart of a data access method according to an embodiment of the present disclosure. The method is implemented based on the storage apparatus provided above. Referring to FIG. 5, the method includes the following steps.

Step 201: Obtain a system bus signal sent by using a system bus, and convert the system bus signal into a rank selection signal and a memory chip bus signal, where the system bus signal includes a system data bus signal and a system address/control bus signal, and the memory chip bus signal includes a memory chip data bus signal and a memory chip address/control bus signal.

The system bus includes a system address/control bus and a system data bus.

Step 202: Determine a selected rank according to the rank selection signal.

Step 203: Output, to each cable of multiple cables according to a correspondence between pins of memory chips in the selected rank and the multiple cables, a memory chip bus signal corresponding to a pin of a memory chip in the selected rank.

According to the present disclosure, two pins in a same position on two sides of a PCB are connected by using one cable. In this case, two extremely short cable sections are connected to the two pins, thereby avoiding a problem of an excessively long cable section connected to one pin when one cable is connected to same pins of two memory chips. In addition, a conversion module, a rank decision device, and a switching array are designed to control a signal of each cable, so that a signal that is input to each cable is corresponding to a pin, connected to the cable, of a memory chip in a selected rank, and an accurate signal that is output to each pin by using the cable is ensured. According to the foregoing solutions, extremely short cable sections connected to two pins ensure SI of the two pins, avoid a multilayered PCB design, and reduce technological PCB requirements.

Figure 6:
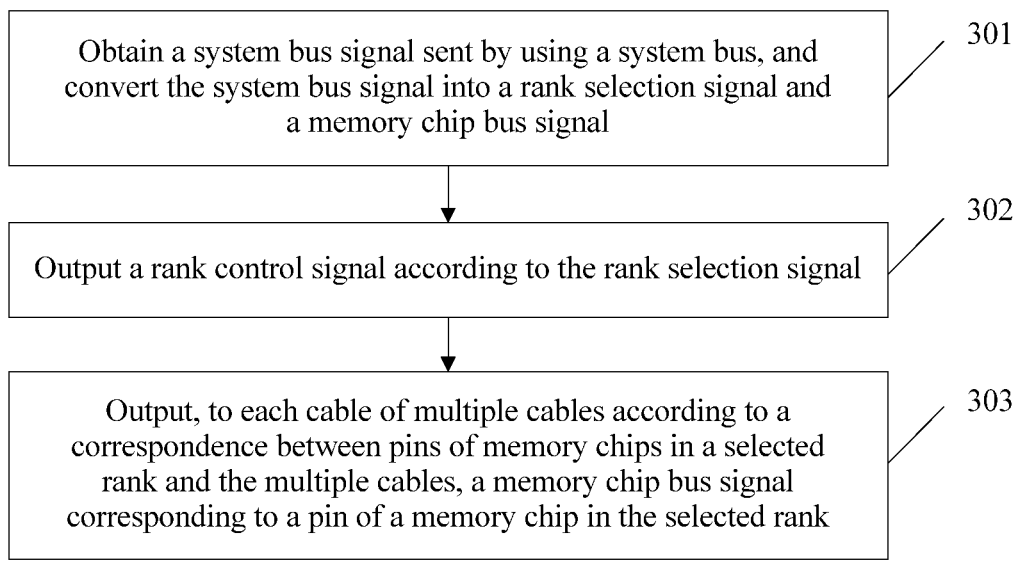
FIG. 6 is a flowchart of a data access method according to an embodiment of the present disclosure.

FIG. 6 is a flowchart of a data access method according to an embodiment of the present disclosure. The method is implemented based on the storage apparatus provided above. Referring to FIG. 6, the method includes the following steps.

Step 301: Obtain a system bus signal sent by using a system bus, and convert the system bus signal into a rank selection signal and a memory chip bus signal, where the system bus signal includes a system data bus signal and a system address/control bus signal, and the memory chip bus signal includes a memory chip data bus signal and a memory chip address/control bus signal.

In a possible implementation manner, step 301 includes: obtaining the system address/control bus signal sent by using a system address/control bus in the system bus, and converting the system address/control bus signal into the rank selection signal and the memory chip address/control bus signal; and obtaining the system data bus signal sent by using a system data bus in the system bus, and converting the system data bus signal into the memory chip data bus signal.

Step 302: Output a rank control signal according to the rank selection signal, where the rank control signal is used to indicate a selected rank.

Step 303: Output, to each cable of multiple cables according to a correspondence between pins of memory chips in the selected rank and the multiple cables, a memory chip bus signal corresponding to a pin of a memory chip in the selected rank.

In a possible implementation manner, step 303 includes: controlling an output signal of each signal output unit according to the correspondence between pins of memory chips in the selected rank and the multiple cables.

In a possible implementation manner, the controlling an output signal of each signal output unit according to the correspondence between pins of memory chips in the selected rank and the multiple cables includes: obtaining the rank control signal; determining, according to a correspondence between the rank control signal and a switch status, a switch status corresponding to the obtained rank control signal, where the switch status is used to indicate that one input end of a single-pole double-throw switch is connected to an output end; and controlling, according to the switch status, one input end of the single-pole double-throw switch to be connected to the output end.

For example, when the rank control signal indicates that the selected rank is a rank 0, an input end of each single-pole double-throw switch that is corresponding to the rank 0 is controlled to be turned on according to the correspondence.

Further, in this embodiment, a correspondence between a rank and an input end of a switch may be further represented by using a position. For example, two input ends of each single-pole double-throw switch are oppositely distributed, an input end on one side (such as the upper side) is corresponding to the rank 0, and an input end on the other side (such as the lower side) is corresponding to the rank 1. Therefore, when the rank control signal indicates that the selected rank is the rank 0, input ends on one side of all single-pole double-throw switches are turned on.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely examples of embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. A storage apparatus comprising:
   a printed circuit board (PCB) comprising:
      a first side; and
      a second side;
   a plurality of memory chips comprising:
      a first array of memory chips disposed on the first side, forming a first rank, and comprising a first memory chip with a first pin located in a first position; and
      a second array of memory chips disposed on the second side, forming a second rank, and comprising a second memory chip with a second pin located in a second position opposite the first position with respect to the PCB;
   a plurality of cables disposed in the PCB and comprising a first cable connected to the first pin and the second pin;
   a converter configured to:
      obtain a system bus signal comprising a system data bus signal and a system address/control bus signal; and
      convert the system bus signal into a rank selection signal and a memory chip bus signal, wherein the memory chip bus signal comprises a memory chip data bus signal and a memory chip address/control bus signal;
   a rank decider configured to determine a selected rank according to the rank selection signal; and
   a switching array configured to output the memory chip bus signal to the cables according to a correspondence between pins of memory chips in the selected rank and the cables, wherein the memory chip bus signal corresponds to a pin of a memory chip in the selected rank.

2. The storage apparatus of claim 1, wherein the converter comprises:
   an address decoder configured to:
      obtain the system address/control bus signal; and
      convert the system address/control bus signal into the rank selection signal and the memory chip address/control bus signal; and
   a data format converter configured to:
      obtain the system data bus signal; and
      convert the system data bus signal into the memory chip data bus signal.

3. The storage apparatus of claim 2, wherein the switching array comprises:
   a plurality of signal outputters, wherein each signal outputter is connected to one of the cables; and
   a controller configured to control an output signal of each signal outputter according to the correspondence.

4. The storage apparatus of claim 3, wherein the signal outputter is a single-pole double-throw switch, wherein an output end of the single-pole double-throw switch is connected to the first cable, wherein two input ends of the single-pole double-throw switch are connected to output terminals of the converter, wherein each output terminal of the converter is connected to an input end of each of two single-pole double-throw switches, wherein the output terminals of the converter are disposed correspondingly to the pins, and wherein the output terminals of the converter and the pins are connected to two ends of a same single-pole double-throw switch.

5. The storage apparatus of claim 4, wherein the rank decider is further configured to output a rank control signal indicating the selected rank, and wherein the controller is further configured to:
obtain the rank control signal;
determine, according to the rank control signal, a switch status corresponding to the rank control signal, wherein the switch status indicates that one input end of the single-pole double-throw switch is connected to the output end of the single-pole double-throw switch; and
control, according to the switch status, one input end of the single-pole double-throw switch to be connected to the output end.

6. The storage apparatus of claim 4, further comprising:
a memory chip address/control bus disposed between the address decoder and the switching array and connecting an input end of the single-pole double-throw switch to an output terminal of the address decoder; and
a memory chip data bus disposed between the data format converter and the switching array and connecting an input end of the single-pole double-throw switch to an output terminal of the data format converter.

7. The storage apparatus of claim 4, wherein single-pole indicates the single-pole double-throw switch comprises an actuator configured to control one electrically separate switch, and wherein double-throw indicates the single-pole double-throw switch comprises two separate wiring path choices other than open.

8. The storage apparatus of claim 1, wherein the converter, the rank decider, and the switching array are integrated on a system on chip (SoC).

9. The storage apparatus of claim 8, wherein the the SoC comprises a memory interface logic circuit, wherein the memory interface logic circuit comprises a double data rate (DDR) controller and a DDR physical layer, wherein the converter and the rank decider are disposed in the DDR controller, and wherein the switching array is disposed in the DDR physical layer.

10. A data access method comprising:
obtaining a system bus signal comprising a system data bus signal and a system address/control bus signal;
converting the system bus signal into a rank selection signal and a memory chip bus signal, wherein the memory chip bus signal comprises a memory chip data bus signal and a memory chip address/control bus signal;
determining a selected rank according to the rank selection signal; and
outputting the memory chip bus signal to each of a plurality of cables according to a correspondence between pins of memory chips in the selected rank and the cables,
wherein the memory chip bus signal corresponds to a pin of a memory chip in the selected rank.

11. The method of claim 10, wherein obtaining the system bus signal and converting the system bus signal comprise:
obtaining the system address/control bus signal;
converting the system address/control bus signal into the rank selection signal and the memory chip address/control bus signal;
obtaining the system data bus signal; and
converting the system data bus signal into the memory chip data bus signal.

12. The method of claim 10, wherein determining the selected rank comprises outputting a rank control signal indicating the selected rank.

13. The method of claim 12, wherein outputting the memory chip bus signal comprises controlling an output signal of each signal outputter according to the correspondence.

14. The method of claim 13, wherein controlling the output signal comprises:
obtaining the rank control signal;
determining, according to the rank control signal, a switch status corresponding to the obtained rank control signal, wherein the switch status indicates that one input end of a single-pole double-throw switch is connected to an output end; and
controlling, according to the switch status, one input end of the single-pole double-throw switch to be connected to the output end.

15. The method of claim 14, wherein single-pole indicates the single-pole double-throw switch comprises an actuator configured to control one electrically separate switch, and wherein double-throw indicates the single-pole double-throw switch comprises two separate wiring path choices other than open.

16. A computer program product comprising computer executable instructions stored on a non-transitory medium that when executed by a processor cause an apparatus to:
obtain a system bus signal comprising a system data bus signal and a system address/control bus signal;
convert the system bus signal into a rank selection signal and a memory chip bus signal, wherein the memory chip bus signal comprises a memory chip data bus signal and a memory chip address/control bus signal;
determine a selected rank according to the rank selection signal; and
output the memory chip bus signal to each of a plurality of cables according to a correspondence between pins of memory chips in the selected rank and the cables,
wherein the memory chip bus signal corresponds to a pin of a memory chip in the selected rank.

17. The computer program product of claim 16, wherein the instructions further cause the apparatus to further obtain the system bus signal and convert the system bus signal by:
obtaining the system address/control bus signal;
converting the system address/control bus signal into the rank selection signal and the memory chip address/control bus signal;
obtaining the system data bus signal; and
converting the system data bus signal into the memory chip data bus signal.

18. The computer program product of claim 16, wherein the instructions further cause the apparatus to further determine the selected rank by outputting a rank control signal indicating the selected rank.

19. The computer program product of claim 18, wherein the instructions further cause the apparatus to further output the memory chip bus signal by controlling an output signal of each signal outputter according to the correspondence.

20. The computer program product of claim 19, wherein the instructions further cause the apparatus to further control the output signal by:
obtaining the rank control signal;
determining, according to the rank control signal, a switch status corresponding to the obtained rank control signal, wherein the switch status indicates that one input end of a single-pole double-throw switch is connected to an output end; and controlling, according to the switch status, one input end of the single-pole double-throw switch to be connected to the output end.

21. The computer program product of claim 20, wherein single-pole indicates the single-pole double-throw switch comprises an actuator configured to control one electrically separate switch, and wherein double-throw indicates the single-pole double-throw switch comprises two separate wiring path choices other than open.

* * * * *